(12) United States Patent
Saito (10) Patent No.: US 8,541,747 B2
(45) Date of Patent: Sep. 24, 2013

(54) SOLID-STATE IMAGE SENSOR AND IMAGE SENSING APPARATUS

(75) Inventor: Makiko Saito, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/446,556

(22) Filed: Apr. 13, 2012

(65) Prior Publication Data

US 2012/0273683 A1 Nov. 1, 2012

(30) Foreign Application Priority Data

Apr. 26, 2011 (JP) ................................. 2011-098676

(51) Int. Cl.
*G01J 5/02* (2006.01)
(52) U.S. Cl.
USPC .......................................................... 250/349
(58) Field of Classification Search
USPC ............... 250/349, 370.01–370.15; 378/98.8
See application file for complete search history.

(56) References Cited

U.S. PATENT DOCUMENTS 6,255,640 B1 * 7/2001 Endo et al. ................. 250/208.1

FOREIGN PATENT DOCUMENTS

JP 2003-031785 1/2003

* cited by examiner

*Primary Examiner* — Kiho Kim
(74) *Attorney, Agent, or Firm* — Cowan, Liebowitz & Latman, P.C.

(57) ABSTRACT

A solid-state image sensor, comprises: a photoelectric conversion layer on which photoelectric conversion elements are arranged; and an wiring layer including at least one layer of a metal film, and an interlayer insulating film which fills a surrounding portion of the metal film, wherein the wiring layer is arranged at a position deeper than the photoelectric conversion layer on a side opposite to a light incidence side with respect to the photoelectric conversion layer, and at least a first metal film arranged at a position closest to the photoelectric conversion layer of the metal film of the wiring layer is arranged on a region which is not irradiated with light rays in a predetermined wavelength range, which light has passed through the photoelectric conversion layer.

9 Claims, 6 Drawing Sheets

SOLID-STATE IMAGE SENSOR AND IMAGE SENSING APPARATUS

BACKGROUND OF THE INVENTION

1. Field of the Invention

The present invention relates to a solid-state image sensor and image sensing apparatus and, more specifically, to a wiring layout of the solid-state image sensor.

2. Description of the Related Art

A general image sensing apparatus such as a digital camera or digital video camera uses a solid-state image sensor such as a CCD image sensor or CMOS image sensor. In a majority of these solid-state image sensors, a plurality of wiring layers of circuitries, wirings, signal read units, and the like are formed on an Si substrate on which a photoelectric conversion layer arranged with elements such as photodiodes as photoelectric conversion elements, which configure pixels, is formed. The plurality of wiring layers are isolated from each other by interlayer films, the uppermost surface is planarized, color filters are formed on the uppermost layer, and microlenses ML used to collect light are formed on the color filters. The solid-state image sensor is irradiated with light coming from an optical system of, for example, a lens connected to an image sensing apparatus from the surface side on which the microlenses are formed.

For the solid-state image sensor, light coming from the optical system of the image sensing apparatus via the microlenses and color filters reaches the photodiodes via the wiring layers. In a route of the incoming light before the photodiodes, if the incoming light is blocked off and reflected by metal wirings of the wiring layers, various problems can occur that cause a drop in image quality. For example, a problem of a sensitivity drop is caused when some incoming light rays are blocked off by some wirings and do not reach the photodiodes. Also, a problem of color mixture that lowers color reproducibility is posed when some light rays reflected by metal wirings become incident on pixels different from those which the rays originally enter to result in poor color separation.

These problems caused by interception and reflection of light by the wiring layers are conspicuous especially in a CMOS image sensor, which requires a plurality of wiring layers due to a complicated wiring layout, of the solid-state image sensors.

As an image sensor which solves the aforementioned problems, a solid-state image sensor called a backside illumination type has been put into practical applications in CMOS image sensors.

In a conventional solid-state image sensor, wiring layers are arranged above color filters, microlenses, and photodiodes, while in the backside illumination solid-state image sensor, wiring layers are formed below photodiodes (for example, FIG. 3 of Japanese Patent Laid-Open No. 2003-31785). With this arrangement, light which has passed through the microlenses and color filters enters the photodiodes without going through the wiring layers, thus solving problems of interception and reflection of light by the wiring layer.

Furthermore, since the wiring layers are not located between the light incident position and the photodiodes, openings required to allow incoming light to enter the photodiodes need not be formed in regions where the wiring layers overlap the photodiodes unlike in the conventional image sensor. Thus, metal wirings on the wiring layers can be laid out without any limitations of these regions, thus enhancing degrees of freedom in wiring layout, and facilitating the complicated wiring layout. This is also a merit of the backside illumination solid-state image sensor. Using this merit, in the commercially available backside illumination solid-state image sensor, metal wirings on the wiring layers are laid out at free positions without forming any openings depending on the positions of the photodiodes, as described in Japanese Patent Laid-Open No. 2003-31785 (FIG. 6).

In the backside illumination solid-state image sensor disclosed in Japanese Patent Laid-Open No. 2003-31785 above, since light enters from a side opposite to the wiring layer side, incoming light can be prevented from being blocked off or reflected by the metal wirings before it reaches the photodiodes, thus solving these problems.

However, since the wiring layers are arranged at positions deeper than the photoelectric conversion layer when viewed from the incident side of light, a new problem is posed. More specifically, light which has once passed through the photoelectric conversion layer is reflected by the wiring layer arranged at the position deeper than the photoelectric conversion layer, and enters the photodiodes of the photoelectric conversion layer again, resulting in a drop in color reproducibility.

The drop in color reproducibility caused by reflected light which enters the photodiodes will be described below. The Si substrate used in the solid-state image sensor has a wavelength dependence on light absorption coefficients, and photoelectric conversion depths in the photodiodes formed on the Si substrate are different depending on wavelengths of incoming light. More specifically, light on the short wavelength side, which light is closer to blue, is photoelectrically converted at a relatively shallow position in the Si substrate, and light on the long wavelength side, which light is closer to red, is photoelectrically converted at a relatively deep position in the Si substrate. Infrared (IR) light is photoelectrically converted while entering to a still deeper position in the Si substrate than the red light. That is, light closer to IR light tends to enter a deeper part in the Si substrate compared to light closer to blue.

For this reason, light of a given wavelength, which has entered the photoelectric conversion layer but is not photoelectrically converted by the photodiodes on the photoelectric conversion layer, passes through the photoelectric conversion layer including the photodiodes, reaches the wiring layer, and is reflected by the metal wirings of the wiring layers. The reflected light strikes the photoelectric conversion layer including the photodiodes again, and is photoelectrically converted by the struck photodiode if that photodiode has sensitivity to a wavelength of the light.

Si (silicon) absorbs light rays up to a wavelength of about 1,100 nm. That is, as is known, Si has sensitivity to light rays up to the wavelength of about 1,100 nm. On the other hand, human eyes have sensitivity to light rays up to a wavelength of about 780 nm. That is, signals obtained by the solid-state image sensor unwantedly include light rays outside a wavelength range to which the human eyes are sensitive.

For a general image sensing apparatus used to shoot photos and videos, reproducibility of a visible object is important. Hence, it is desired that such image sensing apparatus has sensitivity to only visible light of human. If the solid-state image sensor equipped in such image sensing apparatus has sensitivity to IR light, a color reproducibility drop occurs, thus disturbing to shoot preferable photos.

As a countermeasure to be taken against such problems, in a general digital camera, an IR cut filter as one type of optical filters is arranged between the solid-state image sensor and optical lens, thereby preventing the solid-state image sensor from being irradiated with IR light. For example, if an ideal IR cut filter, which can perfectly block off IR light over a full wavelength range, is used, the IR light can be prevented from reaching the solid-state image sensor. However, when use of such ideal IR cut filter results in an increase in component cost of an image sensing apparatus, it is not practical to adopt such filter in an image sensing apparatus which is to be provided to general consumers with as lower price as possible.

Therefore, a digital camera for general users achieves a cost reduction by using an IR cut filter with a limited wavelength range that can be blocked off. More specifically, for example, such IR cut filter blocks off IR light rays within a wavelength range of about 700 nm to 1,000 nm to prevent the solid-state image sensor from being irradiated with these IR light rays. However, since that IR cut filter cannot block off light rays in a wavelength range of about 1,000 nm or higher in terms of its characteristics, some light rays pass through the IR cut filter and enter the solid-state image sensor. Of light rays in the wavelength range of about 1,000 nm or higher, which have reached the solid-state image sensor, those in a wavelength range of about 1,100 nm or lower, to which Si has sensitivity, are photoelectrically converted by the photodiodes. That is, signals obtained by the solid-state image sensor unwantedly include light rays outside the wavelength range to which the human eyes are sensitive.

SUMMARY OF THE INVENTION

The present invention has been made in consideration of the aforementioned problems, and realizes an wiring layout which can suppress sensitivity to light that has passed through a photoelectric conversion layer and can improve color reproducibility in a solid-state image sensor in which wiring layers are arranged at positions deeper than the photoelectric conversion layer.

In order to solve the aforementioned problems, the present invention provides a solid-state image sensor, comprising: a photoelectric conversion layer on which photoelectric conversion elements are arranged; and an wiring layer including at least one layer of a metal film, and an interlayer insulating film which fills a surrounding portion of the metal film, wherein the wiring layer is arranged at a position deeper than the photoelectric conversion layer on a side opposite to a light incidence side with respect to the photoelectric conversion layer, and at least a first metal film arranged at a position closest to the photoelectric conversion layer of the metal film of the wiring layer is arranged on a region which is not irradiated with light rays in a predetermined wavelength range, which light has passed through the photoelectric conversion layer.

In order to solve the aforementioned problems, the present invention provides an image sensing apparatus, comprising: a solid-state image sensor set forth above; and an optical filter which is arranged in front of the solid-state image sensor, and is required to block off infrared light rays in a predetermined wavelength range so as to prevent the solid-state image sensor from being irradiated with the infrared light rays.

In order to solve the aforementioned problems, the present invention provides an image sensing apparatus, comprising: a solid-state image sensor set forth above, the solid-state image sensor having a plurality of pixels; and an optical system required to irradiate the solid-state image sensor with light coming from an object, wherein each of the plurality of pixels comprises the photoelectric conversion layer and at least one wiring layer, and a positional relationship between the photoelectric conversion layer and the metal film is determined according to a positional relationship between an optical center of the optical system and each of the plurality of pixels, so as to prevent at least the first metal film from being irradiated with light rays in a predetermined wavelength range, which light rays pass through the photoelectric conversion layer.

According to the present invention, in a solid-state image sensor in which wiring layers are arranged at positions deeper than a photoelectric conversion layer, sensitivity to light which has passed through the photoelectric conversion layer can be suppressed, and color reproducibility can be improved.

Further features of the present invention will become apparent from the following description of exemplary embodiments (with reference to the attached drawings).

DESCRIPTION OF THE EMBODIMENTS

Embodiments of the present invention will be described in detail below. The following embodiments are merely examples for practicing the present invention. The embodiments should be properly modified or changed depending on various conditions and the structure of an apparatus to which the present invention is applied. The present invention should not be limited to the following embodiments. Also, parts of the embodiments to be described later may be properly combined.

<Configuration of Image Sensing Apparatus>

The configuration of an image sensing apparatus represented by a digital camera, digital video camera, or the like, which can incorporate a solid-state image sensor according to the present invention, will be described first with reference to FIG. 6.

Figure 6:
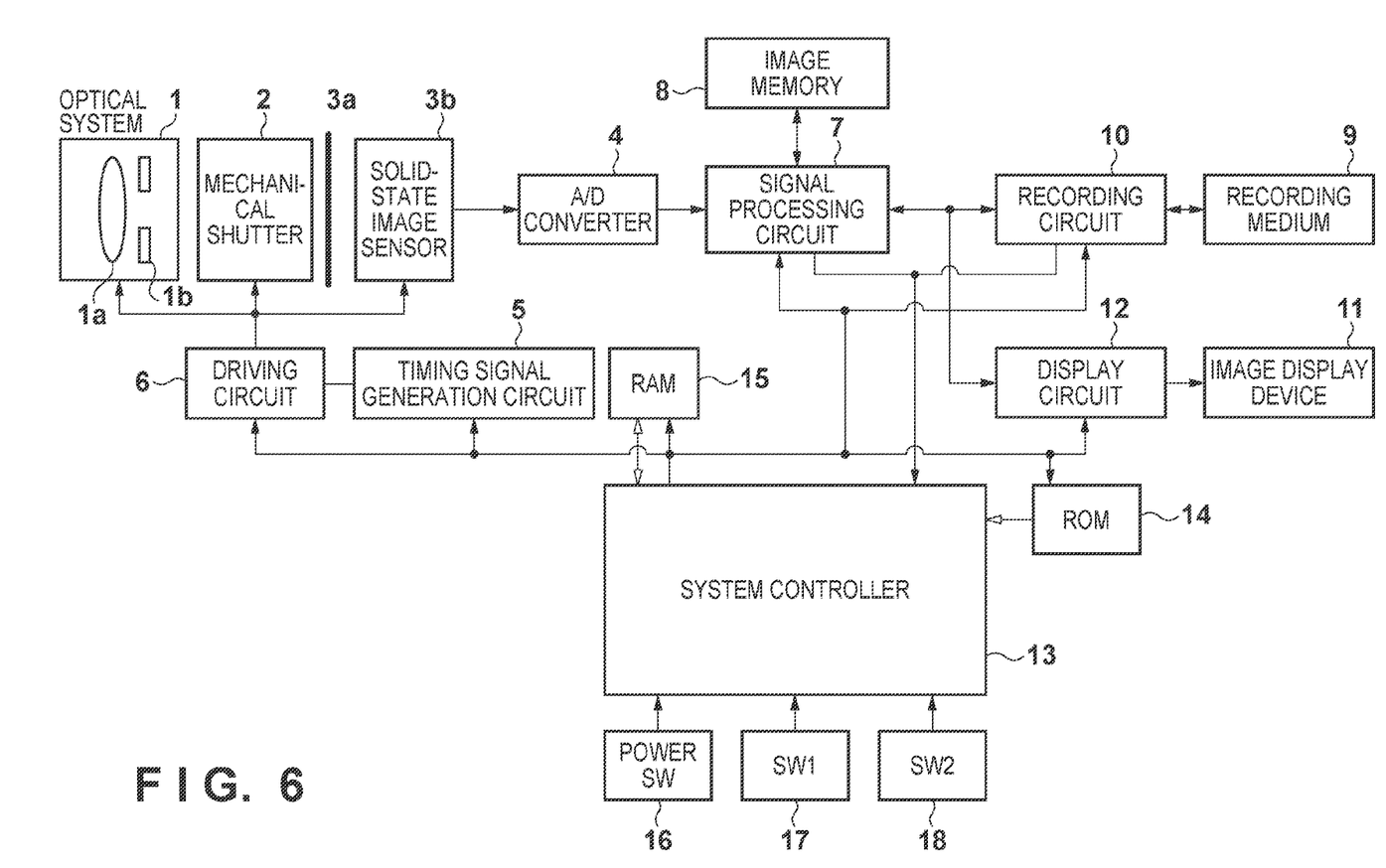
FIG. 6 is a block diagram of an image sensing apparatus which incorporates a solid-state image sensor according to the present invention.

As shown in FIG. 6, the image sensing apparatus of this embodiment includes an optical system 1 which includes a lens 1a and stop 1b, a mechanical shutter 2, an infrared (IR) cut filter 3a which blocks off IR light, a solid-state image sensor 3b, and an A/D converter 4 which converts an analog image signal into a digital signal.

The image sensing apparatus also includes a timing signal generation circuit 5 which generates signals required to drive the solid-state image sensor 3b, a driving circuit 6 for the optical system 1, shutter 2, and solid-state image sensor 3b, and a signal processing circuit 7 which applies required signal processing to image data output from the solid-state image sensor 3b.

Furthermore, the image sensing apparatus includes an image memory 8 which stores image data that has undergone the signal processing, a recording medium 9 such as a memory card which is detachable from the image sensing apparatus, and a recording circuit 10 which records image data that has undergone the signal processing in the recording medium 9.

Moreover, the image sensing apparatus includes an image display device 11 which displays image data that has undergone the signal processing, a display circuit 12 which displays an image on the image display device 11, a system controller 13 which controls the overall image sensing apparatus, a nonvolatile memory (ROM) 14, and a volatile memory (RAM) 15.

The nonvolatile memory 14 stores control programs executed by the system controller 13, control data such as parameters and tables used when the programs are executed, and data used in correction of an image signal.

The programs, control data, and correction data stored in the nonvolatile memory 14 are transferred to and stored in the volatile memory 15, and the system controller 13 uses the volatile memory 15 as a work area when it controls the image sensing apparatus.

In addition, the image sensing apparatus includes a power switch 16 used by the user to turn on/off the power supply of the image sensing apparatus, a switch 17 (SW1) used to start shooting standby operations such as AF and AE, and a shooting switch 18 (SW2) used to start a shooting operation after the operation of the SW1.

<Shooting Operation>

The shooting operation by the image sensing apparatus of this embodiment will be described below.

Prior to the shooting operation, at an activation timing of the system controller 13 (for example, a power-ON timing of the image sensing apparatus), the required programs, control data, and correction data are transferred from the nonvolatile memory 14, and are stored in the volatile memory 15. These programs and data are used when the system controller 13 controls the image sensing apparatus. Also, additional programs and data are transferred from the nonvolatile memory 14 to the volatile memory 15, as needed, or the system controller 13 directly reads out and uses the data stored in the nonvolatile memory 14.

The optical system 1 drives the lens 1a and stop 1b in accordance with a control signal from the system controller 13, so as to form an object image, which is set to have an appropriate brightness level, on the light-receiving surface of the solid-state image sensor 3b.

Next, the mechanical shutter 2 operates to shield the solid-state image sensor 3b in synchronism with the driving operation of the solid-state image sensor 3b, so as to attain a proper exposure time in accordance with a control signal from the system controller 13. When the solid-state image sensor 3b has an electronic shutter function, that function may be used together with the mechanical shutter 2 to assure a proper exposure time.

The solid-state image sensor 3b is driven based on drive pulses according to operation pulses generated by the timing signal generation circuit 5 under the control of the system controller 13, photoelectrically converts an object image into an electrical signal, and outputs the electrical signal as an analog image signal.

The analog image signal output from the solid-state image sensor 3b is converted into a digital signal by the A/D converter 4 according to the operation pulses generated by the timing signal generation circuit 5 under the control of the system controller 13.

Next, the signal processing circuit 7 applies image processing such as various corrections, color conversion, white balance, and gamma correction, resolution conversion processing, image compression processing, and the like to image data, which is converted into the digital signal, under the control of the system controller 13.

The image memory 8 temporarily stores the digital image signal during the signal processing, and stores image data that has undergone the signal processing.

The recording circuit 10 converts image data which has undergone the signal processing in the signal processing circuit 7 or that stored in the image memory 8 into format data (for example, file system data having a hierarchical structure) which matches the recording medium 9, and records the converted data in the recording medium 9.

Also, the image data, which is converted into the digital signal by the A/D converter 4, undergoes the resolution conversion processing in the signal processing circuit 7, and is then converted into a signal (for example, an NTSC analog signal) which matches the image display device 11 by the display circuit 12. Then, the converted signal is displayed on the image display device 11.

In this case, the signal processing circuit 7 may output and record image data (RAW image data), which is converted into the digital signal, intact to and in the image memory 8 or recording circuit 10 without executing any signal processing in accordance with a control signal from the system controller 13.

Also, the signal processing circuit 7 outputs information of the digital signal or image data, which is generated during the signal processing, or information extracted from them to the system controller 13 in accordance with a request from the system controller 13. The information of the digital signal or image data includes, for example, the spatial frequency of an image, an average value of a designated region, a data size of a compressed image, and the like.

The recording circuit 10 outputs information such as the type, free capacity, and the like of the recording medium 9 to the system controller 13 in accordance with a request from the system controller 13.

<Reproduction Operation>

The image reproduction operation by the image sensing apparatus of this embodiment will be described below.

The recording circuit 10 reads out image data from the recording medium 9 in accordance with a control signal from the system controller 13.

The signal processing circuit 7 applies decompression processing to image data if the image data is a compressed image, and stores the decompressed data in the image memory 8 in accordance with control signals from the system controller 13. The image data stored in the image memory 8 undergoes the resolution conversion processing in the signal processing circuit 7, and is then converted into a signal that matches the image display device 11 by the display circuit 12. Then, the converted signal is displayed on the image display device 11.

Note that the aforementioned configuration and operations of the image sensing apparatus are presented only for the exemplary purpose, and the image sensing apparatus which incorporates the solid-state image sensor according to the present invention is not limited to the aforementioned configuration.

<Circuit Arrangement of Pixel Unit>

The circuit arrangement of a pixel unit of the solid-state image sensor of this embodiment will be described below with reference to FIG. 7.

Figure 7:
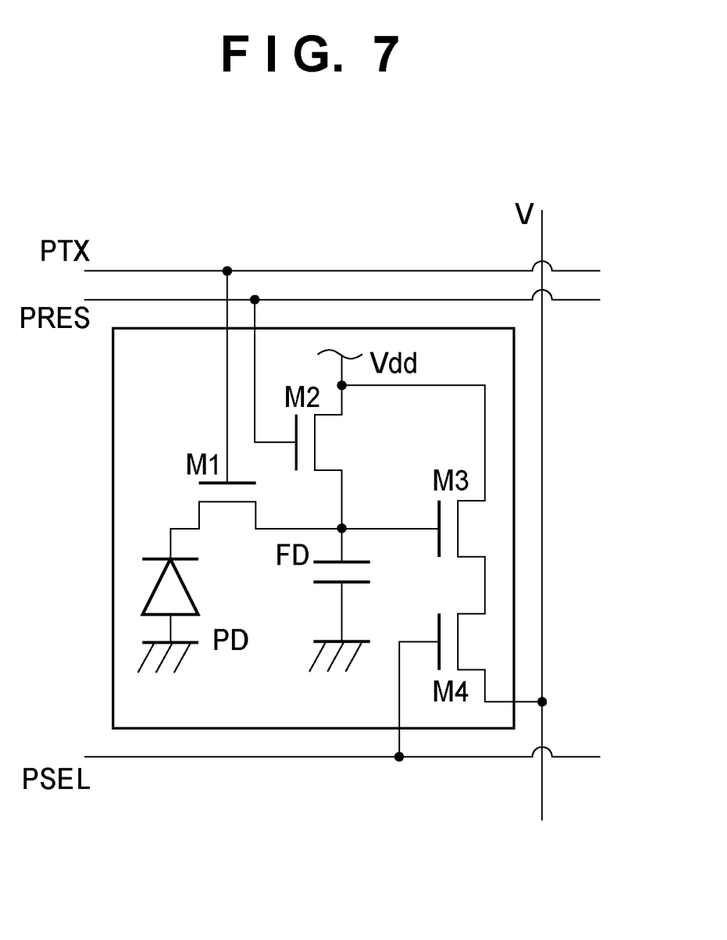
FIG. 7 is an equivalent circuit diagram showing the arrangement of a pixel unit of the solid-state image sensor according to the present invention.

FIG. 7 is an equivalent circuit diagram of a pixel unit in a CMOS image sensor as an example of the circuit arrangement of a pixel unit in the solid-state image sensor of this embodiment. Referring to FIG. 7, the pixel unit includes a photodiode PD which converts a light signal into electric charges. Also, the pixel unit includes a pixel transfer switch M1 which transfers light signal charges accumulated on the photodiode PD, and a pixel reset switch M2 which resets electric charges on the photodiode PD and a floating diffusion FD (the gate of M3). Furthermore, the pixel unit includes an amplifier MOS M3 which converts electric charges of a pixel into a voltage, and amplifies the converted voltage, and a row selection switch M4 which selects a pixel, a signal of which is to be transferred, and outputs the signal onto a vertical output line.

The gate (gate 131 in FIG. 2) of the pixel transfer switch M1 is connected to a vertical scanning circuit (not shown), and is controlled by a pixel transfer signal PTX input from the vertical scanning circuit. The gate of the reset switch M2 is connected to the vertical scanning circuit, and is controlled by a pixel reset signal PRES input from the vertical scanning circuit. The gate of the row selection switch M4 is connected to the vertical scanning circuit, and is controlled by a row selection signal PSEL input from the vertical scanning circuit.

Note that the aforementioned arrangement of the pixel unit in the solid-state image sensor is presented only for the exemplary purpose, and the arrangement of the pixel unit in the solid-state image sensor according to the present invention is not limited to the aforementioned arrangement.

<Layer Arrangement of Pixel Unit>

The layer arrangement of the pixel unit in the solid-state image sensor of this embodiment will be described below with reference to FIGS. 1 to 3.

The solid-state image sensor of this embodiment includes a plurality of pixel units. Each pixel unit is made up of a photoelectric conversion layer 120 on which the photodiode PD as a photoelectric conversion element is arranged, and at least one wiring layer 121 formed of at least one layer of metal films 101 to 103, and interlayer insulating films which fill portions around these metal films. At least one layer of the wiring layer 121 is arranged at a position deeper than the photoelectric conversion layer 120.

First Embodiment

One of features of the present invention lies in a layout of a metal film in an wiring layer of the solid-state image sensor and its determination method. Especially, the present invention features that a layout of at least a metal film (first metal film), which is closest to the photoelectric conversion layer, is determined, so as to prevent light, which has passed through the photodiode, from being reflected by the first metal film and entering the photodiode again.

Figure 1:
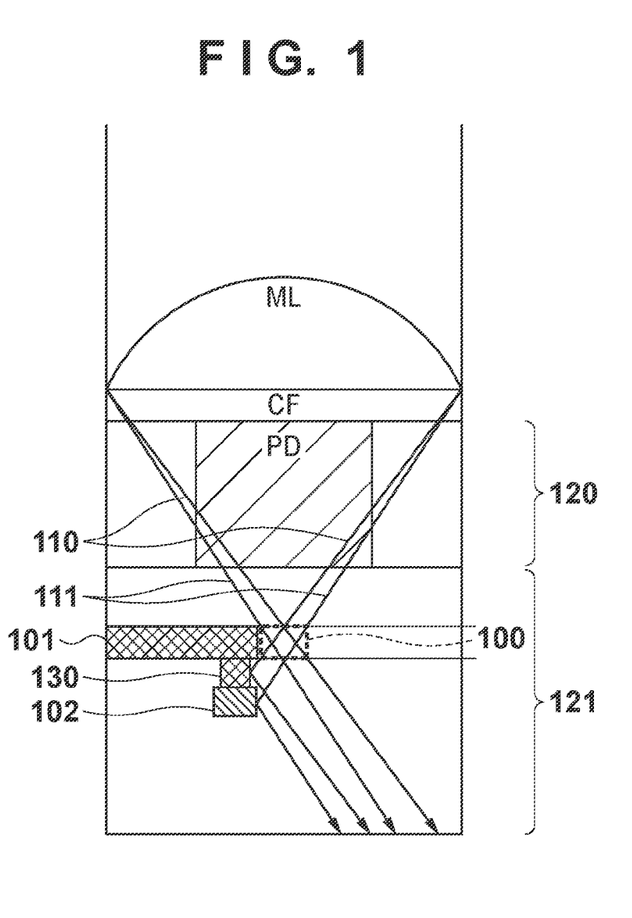
FIG. 1 is a sectional view of a pixel in a solid-state image sensor according to the first embodiment.
Figure 2:
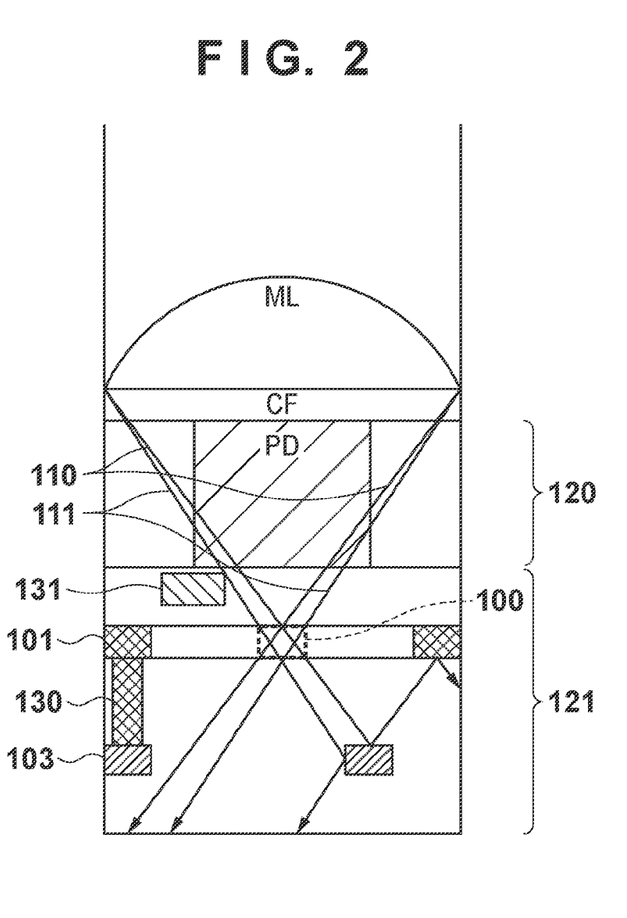
FIG. 2 is a sectional view of the pixel in the solid-state image sensor according to the first embodiment.

As an embodiment which realizes the object of the present invention, the first metal film 101 is not laid out on a region 100 irradiated with light which has passed through the photoelectric conversion layer 120 without being absorbed or photoelectrically converted at a depth position where the first metal film 101 is arranged, as shown in FIGS. 1 and 2. This layout can eliminate re-incidence of light, which has passed through the photoelectric conversion layer, on the photodiode PD due to reflection by the first metal film 101 of the wiring layer.

The wiring layout of the solid-state image sensor according to the first embodiment will be described below with reference to FIGS. 1 to 3.

Figure 3:
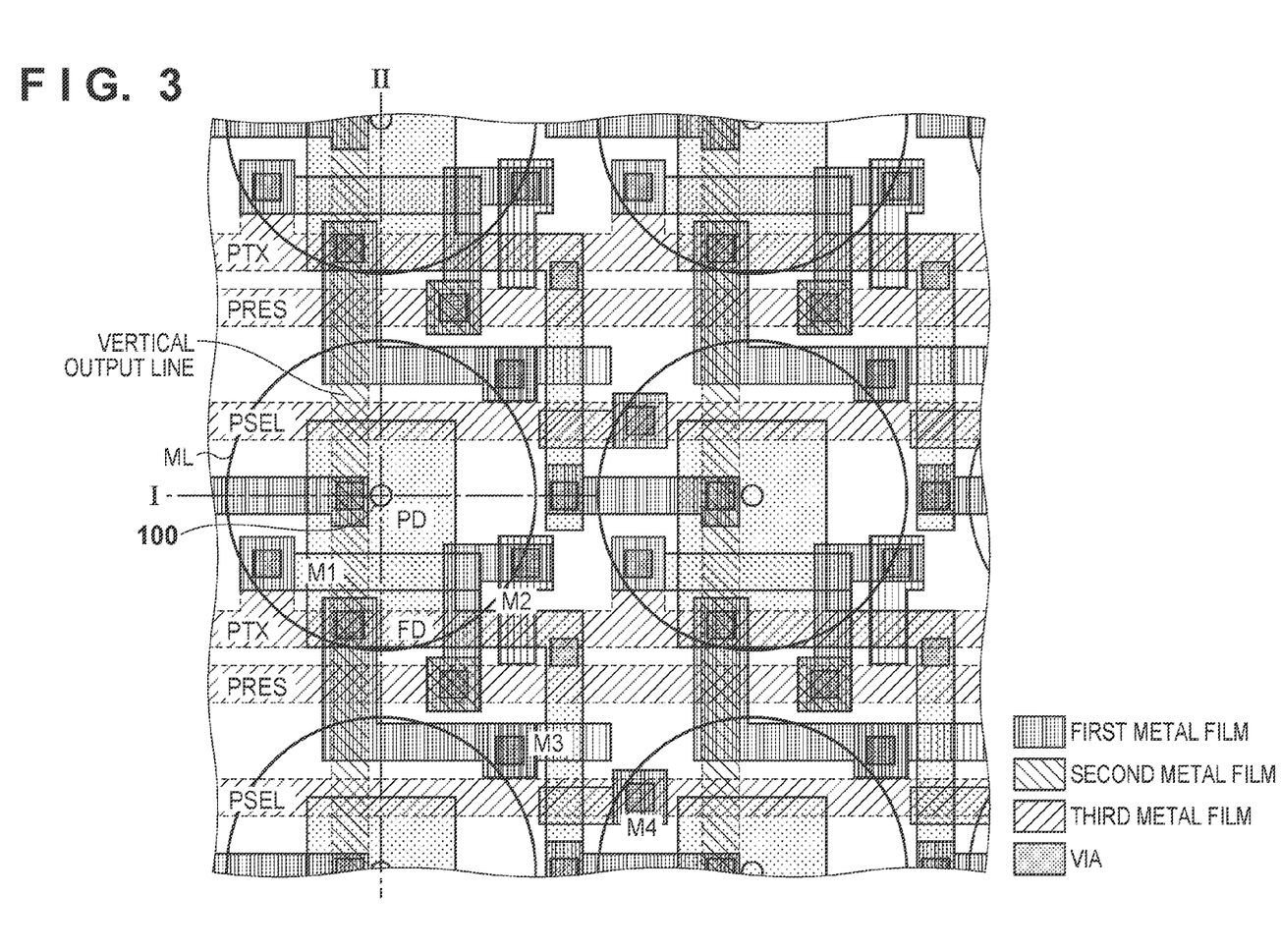
FIG. 3 is a view showing a pixel layout of the solid-state image sensor according to the first embodiment.

FIG. 3 exemplifies a simplified pixel layout as a partial enlarged view of the solid-state image sensor of the first embodiment when viewed from the light incidence surface side. Also, FIG. 1 is a sectional view taken along a broken line I of the portion of the solid-state image sensor shown in FIG. 3, and shows a positional relationship between passing routes (arrows 110 and 111) of light rays of two different arbitrary wavelengths, which enter from the light incidence surface side, and the region 100 where the first metal film 101 is not laid out. FIG. 2 is a sectional view taken along a broken line II of the portion of the solid-state image sensor shown in FIG. 3, and shows a positional relationship between the passing routes (arrows 110 and 111) of light rays of two different arbitrary wavelengths, which enter from the light incidence surface side, and the region 100 where the first metal film 101 is not laid out.

As shown in FIGS. 2 and 3, of respective elements which form the pixel shown in FIG. 7, the photodiode PD and floating diffusion FD are arranged on the photoelectric conversion layer 120. As shown in FIG. 2, the respective switches of the pixel unit including the gate 131 of the pixel transfer switch M1 and the gate electrode of each MOS are arranged between the photoelectric conversion layer 120 and wiring layer 121. As shown in FIGS. 1 to 3, as the first metal film 101, which is arranged at a depth position closest to the photoelectric conversion layer 120, of the wiring layer 121, wirings (metal thin films formed of metals such as Al and Cu) of the pixel unit are mainly laid out. On this film, a metal wiring which connects the gate electrode of the pixel reset switch M2 and the pixel reset signal line PRES, that which connects the FD and the gate electrode of the amplifier MOS M3, that which connects the pixel and vertical output line, and the like are laid out.

As shown in FIGS. 1 and 3, a second metal film 102 is arranged at a position deeper than the first metal film 101 on the side opposite to the light incidence side with respect to the photoelectric conversion layer 120. On the second metal film 102, the vertical output line used to output a signal of the pixel unit is arranged. Although not shown in FIGS. 1 to 3, when there are wirings which extend in the same direction as the vertical output line, such wirings are mainly arranged on this layer. Furthermore, as shown in FIGS. 2 and 3, a third metal film 103 is arranged at a position deeper than the first and second metal films 101 and 102 with respect to the photoelectric conversion layer 120. On this third metal film 103, wirings which extend in a direction perpendicular to the wirings on the second metal film 102 are arranged. On this film, metal wirings used to send control pulse signals to the respective gate electrodes of the pixel unit are arranged. Interlayer insulating films fill portions between the respective metal films.

In the solid-state image sensor of this embodiment, the first metal film 101 is not laid out on the region 100 which is especially located at the same depth position as the first metal film 101 of the wiring layer 121, and through which light rays (arrows 110 and 111) within a predetermined wavelength range pass. In other words, the layout is determined not to arrange the first metal film 101 on the region 100 where light which has passed through the photoelectric conversion layer 120 in the first metal film 101 reaches, so as to prevent the first metal film 101 from being irradiated with light rays within the predetermined wavelength range, which rays have passed through the photoelectric conversion layer 120.

The light rays within the predetermined wavelength range are those, the wavelengths of which are longer than visible light, and are equal to or shorter than the longest wavelength absorbed by the photoelectric conversion layer 120. More specifically, these light rays are IR light rays, whose wavelengths are longer than 780 nm. These IR light rays are those which have passed through the photoelectric conversion layer 120 without being photoelectrically converted or absorbed, and are likely to be photoelectrically converted in terms of the characteristics of the substrate, of light rays which enter the solid-state image sensor 3b.

In this embodiment, the first metal film 101 is not laid out on the region 100 where light rays within a wavelength range from 1,000 nm (arrow 110) to 1,100 nm (arrow 111) as some IR light rays pass the same depth position as the first metal film 101.

In this case, on the incidence side of light to the solid-state image sensor 3b, as shown in FIGS. 1 and 2, a microlens ML serving as a light collecting unit used to collect incoming light for each pixel toward the photodiode PD is preferably arranged. Alternatively, although not shown, an optical member such as an inner lens as a lens having the same function as the microlens ML or a waveguide which guides light to a predetermined position may be arranged between the incidence side of light to the solid-state image sensor 3b and the light incidence surface of the photodiode PD. By collecting incoming light by such optical member of the pixel unit, the position and area of the region 100 where the first metal film 101 is not laid out can be limited in this embodiment.

Especially, it is desirable that at least one of the microlens ML and inner lens collects light rays (arrows 110) of the shortest wavelength of those within the wavelength range, sensitivity to which is not to be provided to the solid-state image sensor 3b, to the optical center of the optical member for each pixel at the depth position (incidence surface) of the first metal film 101.

For example, an optical filter which can intercept predetermined IR light is arranged before a solid-state image sensor incorporated in an image sensing apparatus which desirably has sensitivity to only visible light and is used to shoot still images or moving images. A case will be explained below wherein this optical filter blocks off light rays in a wavelength range from 700 nm to 1,000 nm. Of IR light rays having wavelengths of about 1,000 nm or higher, which reach the solid-state image sensor without being blocked off by the optical filter, light rays of a wavelength of 1,000 nm on the short wavelength side to which the photodiode PD has relatively high sensitivity is in conjugate focus with the optical center for each pixel at a depth where the surface on the photoelectric conversion layer side of the first metal film 101 is located when viewed from the incidence side of the solid-state image sensor (arrows 110). Then, the wiring layer 121 is laid out so as not to wire the first metal film 101 to the region 100 which is irradiated with light rays in a wavelength range from about 1,000 nm (arrows 110) to 1,100 nm (arrows 111) to which the photodiode PD has sensitivity.

In this way, desired effects can be obtained by limiting the position and area of the region 100 where the first metal film 101 is not laid out, and suppressing a decrease in degree of freedom in wiring layout as much as possible.

The region 100 where the first metal film 101 is not laid out is determined depending on a shape of the optical member of each pixel and a material to be used, the configuration of each optical member, and the like so as to include a region where light rays in the predetermined wavelength range pass at the depth position of the first metal film 101 for each pixel. The position and area of the region 100 can be determined based on results obtained by simulations and tests which are conducted in consideration of, for example, the shape of the optical member of each pixel and the material to be used, the configuration of each optical member, and the like.

When the wiring layer of the solid-state image sensor is laid out, as described above, since some light rays within the predetermined wavelength range, which have passed through the first metal film 101, further pass through the second metal film 102, they can be guided to be farther away from the photoelectric conversion layer 120, as shown in FIGS. 1 and 2. Also, light rays reflected by the second metal film 102 are reflected by the surface of the first metal film 101 on the side opposite to the photoelectric conversion layer 120, except for some light ray. Hence, the percentages of light rays which have passed through an opening of the first metal film 101 and reach the photoelectric conversion layer 120 again are greatly reduced.

Figure 8:
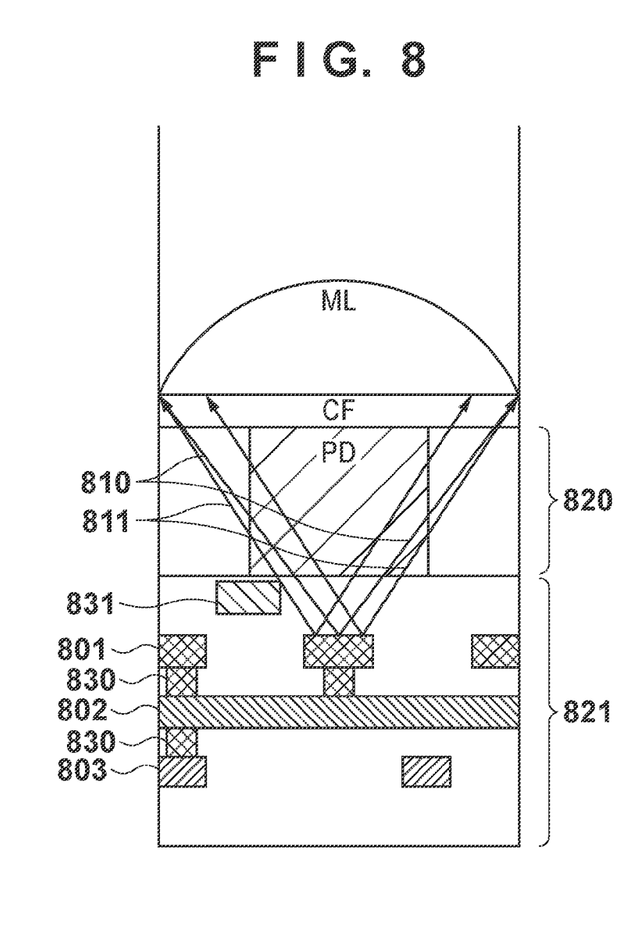
FIG. 8 is a sectional view of a pixel unit of a conventional backside illumination type solid-state image sensor.

Although not shown, only some of light rays, which have passed through the second metal film 102, may not be re-reflected by the first metal film 101, and may reach the photoelectric conversion layer 120. However, compared to the conventional arrangement in which incoming light rays (arrows 810 and 811 in FIG. 8) are reflected by the first metal film (film 801 in FIG. 8) and directly enter the photodiode PD, the solid-state image sensor of this embodiment can prolong paths until incoming light rays reach the photodiode PD. Due to the longer light paths, light rays are attenuated by Si between the layers, and their intensities are smaller than those in the conventional arrangement even if they reach the photodiode PD. Note that in FIG. 8, reference numerals which have the same numerals of the last two digits and have "8" as a numeral of the third digit denote components corresponding to FIGS. 1 and 2.

As described above, a sensitivity reduction of the solid-state image sensor to IR light as the object of the present invention can be achieved.

This embodiment has mentioned about only the layout of the first metal film 101, but it does not particularly specify that of the second metal film 102 or lower. However, by forming an opening where no metal film is laid out in a region to which light that has passed through the photoelectric conversion layer reaches at a depth position at which each metal film is arranged, a distance from the photoelectric conversion layer 120 to the metal film surface by which light may be reflected may be further prolonged.

Figure 9:
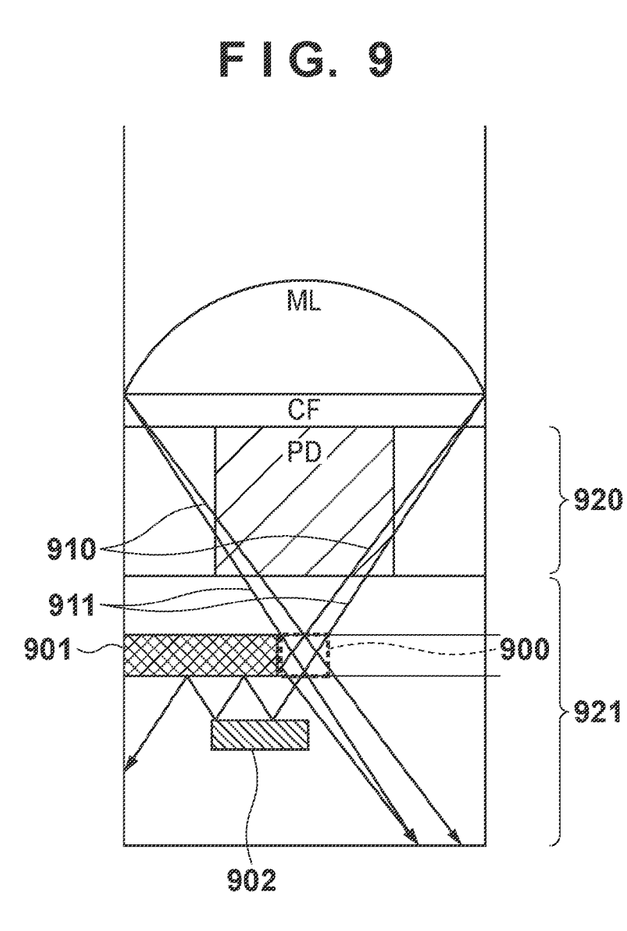
FIG. 9 is a sectional view of a pixel unit of a solid-state image sensor according to a modification of the first embodiment.

In this embodiment, the opening where the first metal film 101 is not laid out is formed in the region 100 irradiated with light which has passed through the photoelectric conversion layer 120 without being absorbed or photoelectrically converted at the depth position at which the first metal film 101 is arranged. However, in practice, a sensitivity reduction of the solid-state image sensor with respect to IR light can be attained as long as a first metal film 901 of a wiring layer 921 is laid out so as to prevent light from being reflected toward a photoelectric conversion layer 920 side, as shown in FIG. 9. For example, a layout which can prevent light reflected by the side surface (the end face of the first metal film 901) of a region 900 from being directed toward the photoelectric conversion layer 920 (that is, the layout that does not cover the region 900 with the metal film 901) may be adopted. Note that in FIG. 9, reference numerals which have the same numerals of the last two digits and have "9" as a numeral of the third digit denote components corresponding to FIGS. 1 and 2.

Also, the layout of respective metal films is determined so that light is reflected by the back surface of a metal film arranged at a shallower position to prevent light reflected by a metal film arranged at a deeper position from entering the photodiode PD while passing through gaps of metal films arranged at positions shallower than this metal film. For example, in FIG. 9, the layout is determined so that the first metal film 901 covers a second metal film 902 except for the region 900 to prevent light 911 reflected by the second metal 902 from entering the photodiode PD while passing through a gap with the first metal film 901. With this layout, a sensitivity reduction of the solid-state image sensor with respect to IR light can also be attained.

Second Embodiment

In an image sensing apparatus, light rays enter a solid-state image sensor at various angles. Especially, angles of incident light rays are largely different on a pixel arranged at a position corresponding to the optical center of an optical system of the image sensing apparatus (the center of an image sensing region of the solid-state image sensor is normally designed to be located at the optical center of the image sensing apparatus) and a pixel arranged at a position distant from the optical center of the image sensing apparatus (which position corresponds to an end portion of the image sensing region of the solid-state image sensor when the center of the image sensing region of the solid-state image sensor is designed to be located at the optical center of the image sensing apparatus). For example, a chief ray which enters the pixel arranged at the optical center of the image sensing apparatus perpendicularly enters the light-receiving surface of the solid-state image sensor, but that which enters a pixel arranged at a position distant from the optical center of the image sensing apparatus leans through a larger angle as its position is farther way from the optical center.

Hence, in order to preferably reduce reflection of light by metal wirings, respective pixels may include non-layout regions of the first metal film 101 in the wiring layer 121 at different positions, in place of adopting the same layout of the wiring layer 121 in all pixels of the solid-state image sensor. More specifically, the non-layout region of the first metal film 101 may be determined at a position optimal to each pixel in accordance with the positional relationship with the optical center of the optical system of the image sensing apparatus.

As the second embodiment, a method of setting a non-layout region of the first metal film 101 at a different position according to the positional relationship between a pixel and the optical center of the optical system of the image sensing apparatus will be described below with reference to FIG. 4 and FIGS. 5A to 5C.

Note that in this embodiment, the method of determining the layout of each metal film of the wiring layer is the same as that of the first embodiment, and this embodiment features that the layout of each metal film is optimized for each pixel, that is, a non-layout region of the first metal film 101 is set at a different position for each pixel.

Figure 4:
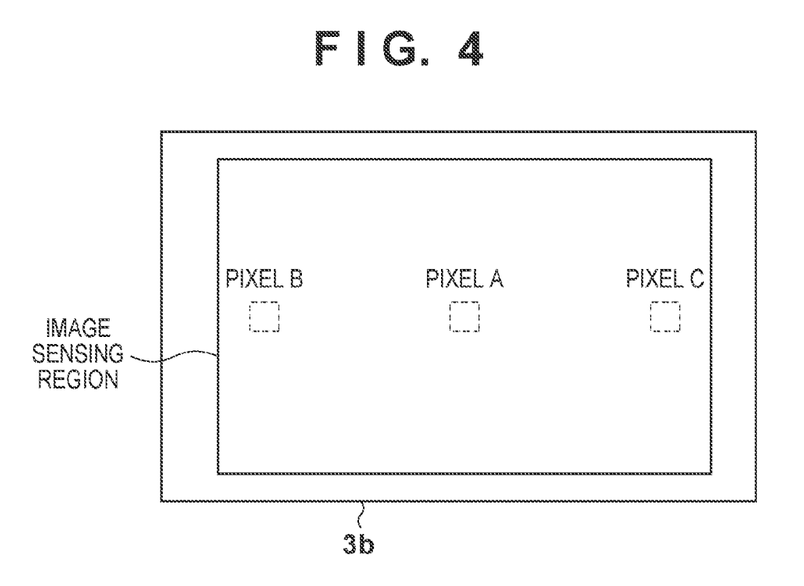
FIG. 4 is a schematic view showing an overall solid-state image sensor according to the second embodiment.
Figure 5A:
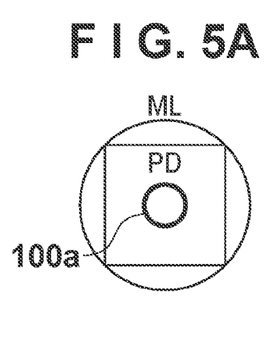
FIGS. 5A to 5C are views for explaining characteristics for respective pixels of the solid-state image sensor according to the second embodiment.
Figure 5B:
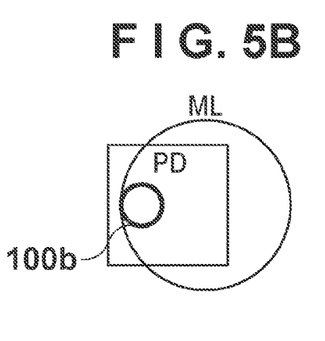
Figure 5C:
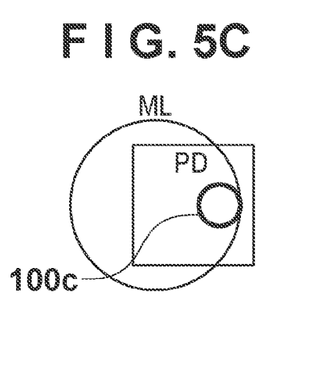

FIG. 4 schematically shows the overall solid-state image sensor of this embodiment. Each of FIGS. 5A to 5C simply shows the positional relationship between a non-layout region (region 100a, 100b, or 100c) of the metal film, and microlens ML and photodiode PD in association with each of pixels A, B, and C of the solid-state image sensor shown in FIG. 4. FIG. 5A shows the pixel A which is arranged at a position corresponding to the optical center of the optical system of the image sensing apparatus in FIG. 4. FIGS. 5B and 5C show the pixels B and C which are arranged at positions distant from the optical center of those in the same row as the pixel arranged at the optical center of the optical system of the image sensing apparatus in FIG. 4.

Referring to FIG. 4, the layout of the pixel A is designed so that the first metal film 101 is not laid out on the region 100a which has nearly the same position as the optical center of the optical system of that pixel as the center, as shown in FIG. 5A.

Also, the layout of the pixel B is designed so that the first metal film 101 is not laid out on the region 100b, which is offset in a left direction compared to the pixel A, in correspondence with a path of light which enters via the optical system of the image sensing apparatus and that of the pixel B. Likewise, the layout of the pixel C is designed so that the first metal film 101 is not laid out on the region 100c, which is offset in a right direction (that is, a direction opposite to the region 100b of the pixel B) compared to the pixel A, in correspondence with a path of light which enters via the optical system of the image sensing apparatus and that of the pixel C.

Likewise, as for other pixels (not shown), for example, the layout of a pixel, which is arranged at a position distant from the optical center, of those in the same column as the pixel arranged at the optical center of the optical system of the image sensing apparatus, is designed so that the first metal film 101 is not laid out on a region offset in the vertical direction. In this manner, the layout of each metal film of the wiring layer 121 is determined so as not to lay out the first metal film 101 at a position offset from that of the pixel A in correspondence with a path of light which enters the optical system of the image sensing apparatus and that of the corresponding pixel.

According to the second embodiment, reflection of light by the wiring layer can be preferably reduced independently of pixel positions.

It is desirable to set non-layout regions of the first metal film 101 at different positions for respective pixels, that is, to locate these regions at optimal positions in all the pixels. Alternatively, respective predetermined groups of regions may be set at different positions for the sake of simplicity.

Although not shown, in a solid-state image sensor in which a light-shielding region of pixels is assured in addition to the image sensing region, so as to obtain a reference signal of the solid-state image sensor, the metal film may be laid out so as to prevent light that has passed through the image sensing region from entering the light-shielding region (so as to block off light from entering the light-shielding region). Alternatively, a light-shielding layer that intercepts light or a reflection layer that reflects light may be arranged between the photoelectric conversion layer and arbitrary metal film so as to block off light from entering gaps between wirings caused by the wiring layout.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-098676, filed Apr. 26, 2011, which is hereby incorporated by reference herein in its entirety.

What is claimed is:

1. A solid-state image sensor, comprising:
    a photoelectric conversion layer on which photoelectric conversion elements are arranged; and
    an wiring layer including at least one layer of a metal film, and an interlayer insulating film which fills a surrounding portion of the metal film,
    wherein said wiring layer is arranged at a position deeper than said photoelectric conversion layer on a side opposite to a light incidence side with respect to said photoelectric conversion layer, and
    at least a first metal film arranged at a position closest to said photoelectric conversion layer of the metal film of said wiring layer is arranged on a region which is not irradiated with light rays in a predetermined wavelength range, which light has passed through said photoelectric conversion layer.

2. The sensor according to claim 1, further comprising a light collecting unit which collects light with which said solid-state image sensor is irradiated toward said photoelectric conversion layer.

3. The sensor according to claim 2, wherein said light collecting unit is arranged so that a light ray of a shortest wavelength of the light rays in the predetermined wavelength range is in conjugate focus with the region.

4. The sensor according to claim 1, wherein the light rays in the predetermined wavelength range are light rays having wavelengths longer than visible light.

5. The sensor according to claim 4, wherein the light rays having the wavelengths longer than the visible light are light rays having wavelengths longer than 780 nm.

6. The sensor according to claim 1, wherein the light rays in the predetermined wavelength range are infrared light rays, and are light rays having wavelengths not more than a longest wavelength which is absorbed by said photoelectric conversion layer.

7. An image sensing apparatus, comprising:
a solid-state image sensor according to claim 1; and
an optical filter which is arranged in front of said solid-state image sensor, and is required to block off infrared light rays in a predetermined wavelength range so as to prevent said solid-state image sensor from being irradiated with the infrared light rays.

8. The apparatus according to claim 7, wherein an opening is formed in the first metal film so as to prevent the first metal film from being irradiated with light rays having wavelengths which pass through said optical filter of the infrared light rays.

9. An image sensing apparatus, comprising:
a solid-state image sensor according to claim 1, said solid-state image sensor having a plurality of pixels; and
an optical system required to irradiate said solid-state image sensor with light coming from an object,
wherein each of the plurality of pixels comprises the photoelectric conversion layer and at least one wiring layer, and
a positional relationship between the photoelectric conversion layer and the metal film is determined according to a positional relationship between an optical center of said optical system and each of the plurality of pixels, so as to prevent at least the first metal film from being irradiated with light rays in a predetermined wavelength range, which light rays pass through the photoelectric conversion layer.

* * * * *